(12) United States Patent
Yoo et al.

(10) Patent No.: US 10,840,305 B2
(45) Date of Patent: Nov. 17, 2020

(54) ORGANIC LIGHT EMITTING DIODE DISPLAY DEVICE

(71) Applicant: LG Display Co., Ltd., Seoul (KR)

(72) Inventors: Dong-Hee Yoo, Paju-si (KR);
Seog-Shin Kang, Paju-si (KR);
Yeon-Suk Kang, Paju-si (KR)

(73) Assignee: LG DISPLAY CO, LTD., Seoul (KR)

( * ) Notice: Subject to any disclaimer, the term of this patent is extended or adjusted under 35 U.S.C. 154(b) by 0 days.

(21) Appl. No.: 16/216,517

(22) Filed: Dec. 11, 2018

(65) Prior Publication Data
US 2019/0198577 A1 Jun. 27, 2019

(30) Foreign Application Priority Data
Dec. 22, 2017 (KR) .................. 10-2017-0178402

(51) Int. Cl.
*H01L 27/32* (2006.01)
*H01L 51/50* (2006.01)
*H01L 51/52* (2006.01)

(52) U.S. Cl.
CPC ...... *H01L 27/3211* (2013.01); *H01L 27/3262* (2013.01); *H01L 51/50* (2013.01); *H01L 51/504* (2013.01); H01L 51/5004 (2013.01); H01L 51/5072 (2013.01); H01L 51/5088 (2013.01); H01L 51/5092 (2013.01); H01L 51/5265 (2013.01); H01L 2227/323 (2013.01); H01L 2251/558 (2013.01)

(58) Field of Classification Search
None
See application file for complete search history.

(56) References Cited

U.S. PATENT DOCUMENTS

| 2008/0001535 | A1 | 1/2008 | Kim et al. |
| 2014/0183464 | A1* | 7/2014 | Baek .................. H01L 27/3213 257/40 |
| 2017/0149018 | A1* | 5/2017 | Choi .................. H01L 27/3246 |
| 2017/0331073 | A1 | 11/2017 | Choi et al. |
| 2019/0081116 | A1* | 3/2019 | Kondo .................. H01L 51/56 |

FOREIGN PATENT DOCUMENTS

TW 201421671 A 6/2014

OTHER PUBLICATIONS

Kim, J-H. "Designing an electron-transport layer for highly efficient, reliable, and solution-processed organic light-emitting diodes" Journal of Materials Chemistry C , Issue 12, Mar. 28, 2017, pp. 3097-3106 (Year: 2017).*

* cited by examiner

*Primary Examiner* — Grant S Withers
(74) *Attorney, Agent, or Firm* — Birch, Stewart, Kolasch & Birch, LLP

(57) ABSTRACT

An organic light emitting diode display device in one example includes a substrate including first to third subpixels, a first electrode in each of the first to third subpixels, a hole injection layer on the first electrode in each of the first to third subpixels, first to third light emitting layers each on the hole injection layer in each of the first to third subpixels, first to third inorganic patterns which are on the first to third emitting layers in the first to third subpixels, respectively, an electron injection layer which is on the first to third inorganic patterns and is over the entire surfaces of the first to third subpixels, and a second electrode which is on the electron injection layer and is over the entire surfaces of the first to third subpixels.

18 Claims, 9 Drawing Sheets

ORGANIC LIGHT EMITTING DIODE DISPLAY DEVICE

CROSS-REFERENCE TO RELATED APPLICATIONS

The present application claims the priority benefit of Korean Patent Application No. 10-2017-0178402 filed in the Republic of Korea on Dec. 22, 2017, which is hereby incorporated by reference in its entirety for all purposes as if fully set forth herein.

BACKGROUND OF THE INVENTION

Field of the Invention

The present invention relates to an organic light emitting diode display device in which an organic light emitting layer can be stably formed at each subpixel through a photolithography process.

Discussion of the Related Art

Recently, with the advent of an information-oriented society, as interest in information displays for processing and displaying a massive amount of information and demand for portable information media have increased, a display field has rapidly advanced. Thus, various light and thin flat panel display devices have been developed and highlighted.

As specific examples of the flat display devices, there are a liquid crystal display (LCD) device, a plasma display panel (PDP) device, a field emission display (FED) device, an electroluminescence display (ELD) device, an organic light emitting diode (OLED) display device, and the like. The flat display devices exhibit excellent characteristics in terms of thinning, lightening, and reductions in the power consumption thereof and thus have rapidly replaced the conventional cathode ray tube (CRT) displays.

Among the flat panel display devices, the OLED display device is a self-luminescent type device and does not require a backlight unit used in the LCD device as a non-self luminescent type device. As a result, the OLED display device has light weight and a thin profile In addition, the OLED display device has advantages of a viewing angle, a contrast ratio, and power consumption as compared with the LCD device. Furthermore, the OLED display device can be driven with a low direct current (DC) voltage and has a rapid response speed. Moreover, since the inner elements of the OLED display device have a solid phase, the OLED display device has high durability against an external impact and has a wide available temperature range.

Specifically, since the OLED display device is manufactured through a simple process, manufacturing costs can be reduced as compared with the conventional LCD device.

The OLED display device is a self-luminescent type device emitting light through a light emitting diode (LED). The LED emits light through an organic electroluminescence phenomenon.

FIG. 1 is a band diagram illustrating an LED having an emission principle based on an organic electroluminescence phenomenon.

As shown in FIG. 1, an LED 10 includes an anode 21, a cathode 25, and an organic light emitting layer disposed between the anode 21 and the cathode 25. The organic light emitting layer includes a hole transport layer (HTL) 33, an electron transport layer (ETL) 35, and an emission material layer (EML) 40 interposed between the HTL 33 and the ETL 35.

In order to improve luminous efficiency, a hole injection layer (HIL) 37 is interposed between the anode 21 and the HTL 33, and an electron injection layer (EIL) 39 is interposed between the cathode 25 and the ETL 35.

In the LED 10, when positive and negative voltages are respectively applied to the anode 21 and the cathode 25, holes of the anode 21 and electrons of the cathode 25 are transported to the EML 40 to form excitons. When the excitons are transitioned from an excited state to a ground state, light is generated and emitted in the form of visible light by the EML 40.

In order for an OLED display device including the LED 10 to implement full colors, organic light emitting layers respectively emit red, green and blue light and are separately formed at respective subpixels. It is, however, difficult to stably pattern the organic light emitting layers at the respective subpixels through a current photolithography process.

SUMMARY

Accordingly, the present invention is directed to an organic light emitting diode (OLED) display device that substantially obviates one or more of the problems due to limitations and disadvantages of the related art.

An object of the present invention is to provide an OLED display device that can stably form an organic light-emitting layer at each subpixel through a photolithography process.

Additional features and advantages of the invention will be set forth in the description which follows, and in part will be apparent from the description, or can be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an organic light emitting diode display device includes a substrate including first to third subpixels, a first electrode in each of the first to third subpixels, a hole injection layer on the first electrode in each of the first to third subpixels, first to third light emitting layers each on the hole injection layer in each of the first to third subpixels, first to third inorganic patterns which are on the first to third emitting layers in the first to third subpixels, respectively, an electron injection layer which is on the first to third inorganic patterns and is over entire surfaces of the first to third subpixels, and a second electrode which is on the electron injection layer and is over the entire surfaces of the first to third subpixels.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Reference will now be made in detail to exemplary embodiments, examples of which are illustrated in the accompanying drawings. The same reference numbers can be used throughout the drawings to refer to the same or like parts.

Figure 1:
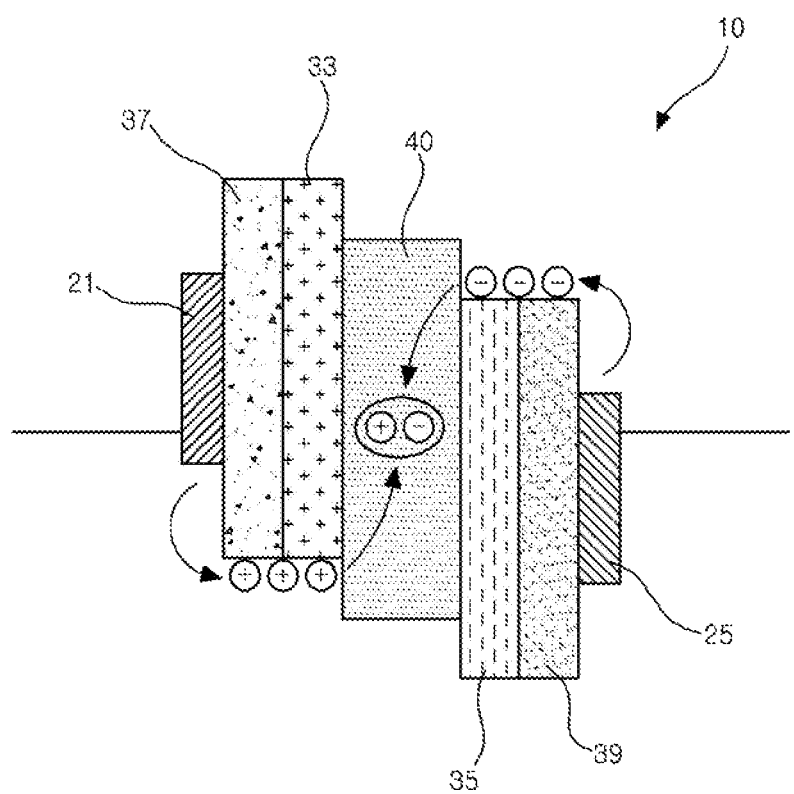
FIG. 1 is a band diagram illustrating a light emitting diode (LED) having an emission principle based on an organic electroluminescence phenomenon.
Figure 2:
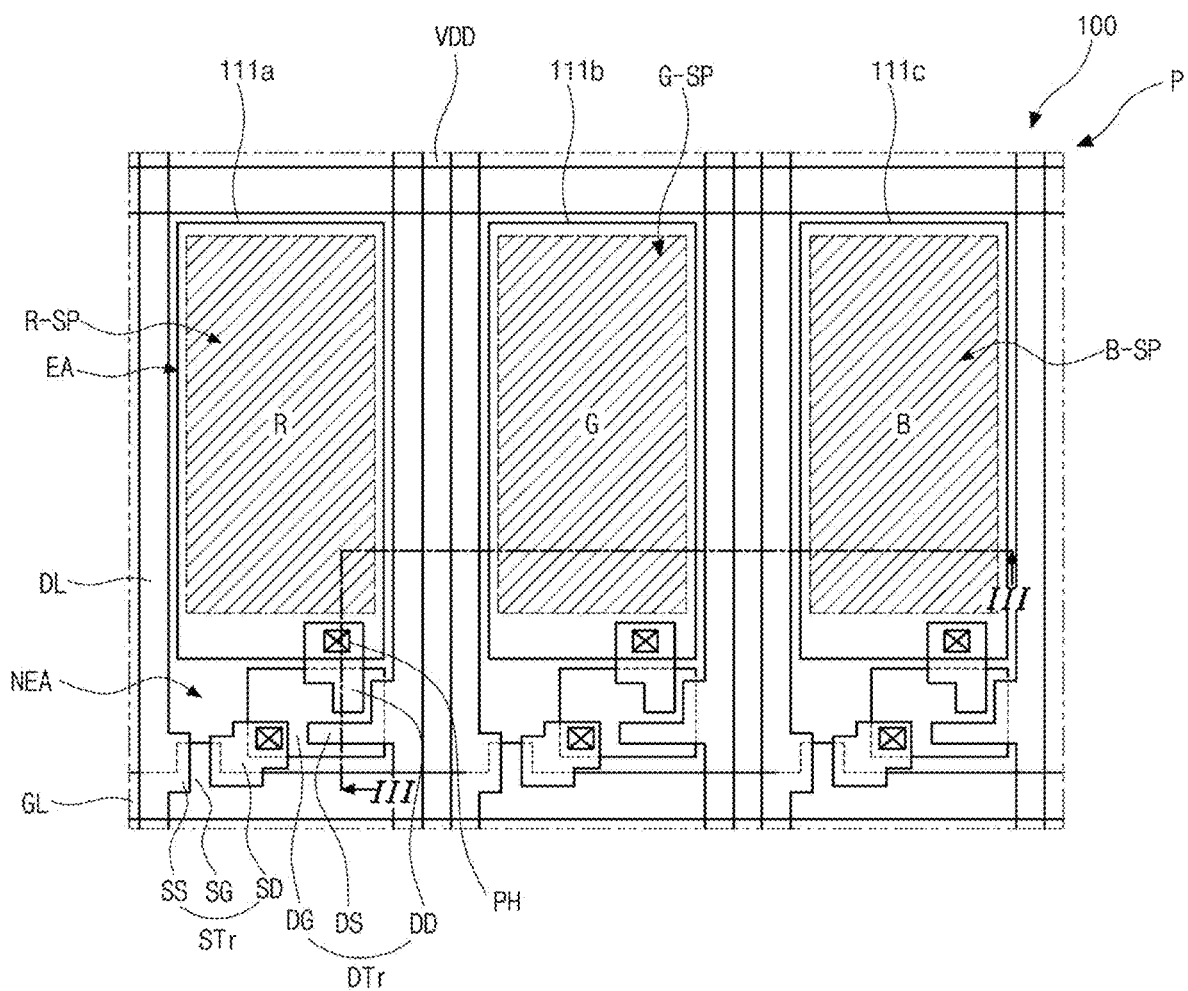
FIG. 2 is a plan view illustrating a structure of a unit pixel including three subpixels in an organic light emitting diode (OLED) display device according to an embodiment of the present invention.

FIG. 2 is a plan view illustrating a structure of a unit pixel including three subpixels in an organic light emitting diode (OLED) display device according to an embodiment of the present invention. All the components of the OLED displays according to all embodiments of the present invention are operatively coupled and configured.

Figure 3:
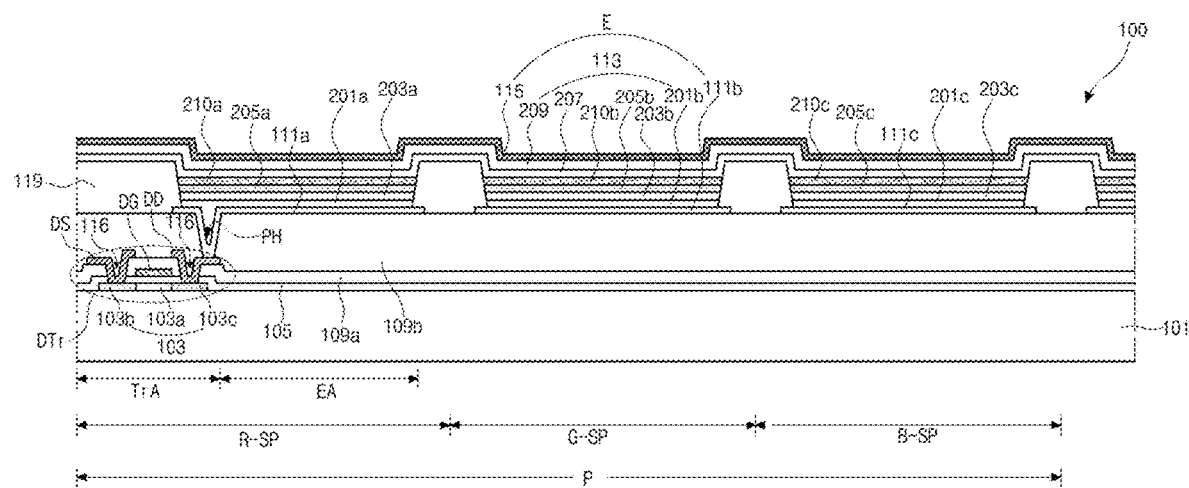
FIG. 3 is a cross-sectional view taken along line of FIG. 2.

FIG. 3 is a cross-sectional view taken along line of FIG. 2. FIG. 3 illustrates an example of the structure of the unit pixel P including three subpixels R-SP, G-SP, and B-SP in the OLED display device according to the embodiment of the present invention.

An OLED display device 100 according to an embodiment of the present invention is classified into a top emission type or a bottom emission type according to a transmission direction of emitted light. Hereinafter, the bottom emission type is described by way of example.

As shown in FIG. 2, in the OLED 100 according to the embodiment of the present invention, there exists a plurality of unit pixels P. Each or some of the unit pixels P includes red, green, and blue subpixels R-SP, G-SP, and B-SP. Each of the subpixels R-SP, G-SP, and B-SP includes an emission region EA. A bank 119 is disposed along an edge of the emission region EA to define a non-emission region NEA.

For the convenience of description, the subpixels R-SP, G-SP, and B-SP are illustrated as having the same width and being disposed in parallel to each other. Alternatively, the subpixels R-SP, G-SP, and B-SP can have different widths and various structures.

Switching and driving thin film transistors STr and DTr are provided in the non-emission region NEA of each of the subpixels R-SP, G-SP, and B-SP. A light emitting diode (LED) E including a first electrodes 111a, 111b, 111c, an organic light emitting layer 113, and a second electrode 115 is disposed in the emission region EA in each of the subpixels R-SP, G-SP, and B-SP.

The switching thin film transistor STr and the driving thin film transistor DTr are connected to each other, and the driving thin film transistor DTr is connected to the LED E.

Gate lines SL, data lines DL, and power lines VDD are disposed on a substrate 101 to define the subpixels R-SP, G-SP, and B-SP.

The switching thin film transistor STr is formed at a portion where the gate line SL and the data line DL cross each other. The switching thin film transistor STr functions to select the corresponding subpixel R-SP, G-SP, or B-SP.

The switching thin film transistor STr includes a gate electrode SG branched from the gate line GL, a semiconductor layer, a source electrode SS, and a drain electrode SD.

The driving thin film transistor DTr functions to drive the LED E of the subpixel R-SP, G-SP, or B-SP selected by the switching thin film transistor STr. The driving thin film transistor DTr includes a gate electrode DG connected to the drain electrode SD of the switching thin film transistor STr, a semiconductor layer 103, a source electrode DS connected to the power line VDD, and a drain electrode DD.

The drain electrode DD of the driving thin film transistor DTr is connected to the first electrodes 111a, 111b, 111c each of the LED E. The organic light emitting layer 113 is each interposed between the first electrodes 111a, 111b, 111c and the second electrode 115.

Referring to FIG. 3, the semiconductor layer 103 is disposed in a switching region TrA of each of the subpixels R-SP, G-SP, and B-SP on the substrate 101. The semiconductor layer 103 can be made of silicon and has an active region 103a serving as a channel and disposed at a central portion thereof, a source region 103b, and a drain region 103c, which are doped with high concentration impurities and are disposed at both sides of the active region 103a.

A gate insulating layer 105 is disposed on the semiconductor layer 103. The gate electrode DG and a gate line GL, which extends in a direction, are provided on the gate insulating layer 105 so as to correspond to the active region 103a of the semiconductor layer 103.

In addition, a first interlayer insulating layer 109a is disposed on the gate electrode DG and the gate line GL. In this case, the first interlayer insulating layer 109a and the gate insulating layer 105 have first and second semiconductor layer contact holes 116 configured to respectively expose the source and drain regions 103b and 103c.

The source and drain electrodes DS and DD are spaced apart from each other on the first interlayer insulating layer 109a and are respectively in contact with the source and drain regions 103b and 103c through the first and second semiconductor layer contact holes 116.

A second interlayer insulating layer 109b is disposed on the first interlayer insulating layer 109a and the source and drain electrodes DS and DD, and has a drain contact hole PH configured to expose the drain electrode DD of the driving thin film transistor DTr.

In this case, the source and drain electrodes DS and DD, the semiconductor layer 103, the gate insulating layer 105, and the gate electrode DG constitute the driving thin film transistor DTr.

The switching thin film transistor STr can have the same structure as the driving thin film transistor DTr and is connected to the driving thin film transistor DTr.

In this embodiment, the driving thin film transistor DTr having a top gate structure with the semiconductor layer 103 formed as a polycrystalline silicon layer or oxide semiconductor layer is described by way of example. Alternatively, the driving thin film transistor DTr can have a bottom gate structure with the semiconductor layer 103 formed as an amorphous silicon layer.

When the semiconductor layer 103 is formed as the oxide semiconductor layer, a light shielding layer can be disposed below the semiconductor layer 103. A buffer layer can be disposed between the light shielding layer and the semiconductor layer 103.

In addition, the first electrodes 111a, 111b, 111c are each disposed on the second interlayer insulating layer 109b corresponding to the emission region EA of each of the subpixels R-SP, G-SP, and B-SP. The first electrode 111 is connected to the drain electrode DD of the driving thin film transistor DTr and can be made of a material having a relatively high work function to form an anode of the LED E.

The first electrodes 111a, 111b, 111c can be made of a metal oxide such as indium tin oxide (ITO) or indium zinc oxide (IZO), a mixture of a metal and an oxide such as ZnO:Al or $SnO_2$:Sb, or a conductive polymer such as poly(3-methylthiophene), poly[3,4-(ethylene-1,2-dioxy) thiophene] (PEDT), polypyrrole, or polyaniline. Alternatively, the first electrode 111 can be made of carbon nano tubes (CNTs), graphene, silver nano wires, or the like.

The first electrodes 111a, 111b, 111c are each disposed in each of the subpixels R-SP, G-SP, and B-SP. A bank 119 is disposed between the first electrodes 111a, 111b, 111c of the subpixels R-SP, G-SP, and B-SP. In other words, the bank 119 is disposed along an edge of each pixel region P. The first electrodes 111a, 111b, 111c are separate from each other with the bank 119 as a boundary portion of each pixel region.

The organic light emitting layer 113 is disposed on the first electrodes 111a, 111b, 111c, and the second electrode 115 serving as a cathode is entirely disposed on the organic light emitting layer 113.

The second electrode 115 can be made of a material having a relatively low work function. The second electrode 115 can be formed with a single layer or multiple layers using a first metal such as Ag and a second metal such as Mg, and the single layer can be made of an alloy of the first and second metals at a predetermined ratio thereof.

In the OLED display device 100, when predetermined voltages are applied to the first electrodes 111a, 111b, 111c and the second electrode 115, holes injected from the first electrodes 111a, 111b, 111c and electrons injected from the second electrode 115 are transported to the organic light emitting layer 113 to form excitons. When the excitons are transitioned from an excited state to a ground state, light is generated and emitted in the form of visible light.

In this case, the emitted light passes through the transparent first electrodes 111a, 111b, 111c and is emitted to the outside so that the OLED display device 100 can display an image.

The OLED display device 100 according to the embodiment of the present invention is a bottom emission type in which light emitted from the organic light emitting layer 113 is output to the outside through the first electrodes 111a, 111b, 111c. In this case, the second electrode 115 can further include a reflective layer made of an opaque conductive material. In an example, the reflective layer can be made of an aluminum-palladium-copper (APC) alloy, and the second electrode 115 can have a triple-layered structure of ITO/APC/ITO.

In addition, the first electrodes 111a, 111b, 111c can be made of a semi-transmissive conductive material such as magnesium (Mg), silver (Ag), or an alloy of magnesium (Mg) and silver (Ag). When the first electrodes 111a, 111b, 111c are made of the semi-transmissive conductive material, luminous efficiency can be improved due to a micro cavity effect. This is described in more detail below.

In order to improve luminous efficiency, the organic light emitting layer 113 can include multi layers of a hole injection layers 201a, 201b, 201c, a hole transport layers 203a, 203b, 203c, an emitting material layer 205a, 205b, or 205c, an electron transport layer 207, and an electron injection layer 209. The emitting material layer 205a, 205b, or 205c of the organic light emitting layer 113, which emits red, or green, or blue light, is disposed at the corresponding one of the subpixels R-SP, G-SP, and B-SP.

In other words, the organic light emitting layer 113 disposed to correspond to the red subpixel R-SP includes a red-emitting material layer 205a. The organic light emitting layer 113 disposed to correspond to the green subpixel G-SP includes a green-emitting material layer 205b. The organic light emitting layer 113 disposed to correspond to the blue subpixel B-SP includes a blue-emitting material layer 205c.

The red-emitting, green-emitting, and blue-emitting material layers 205a, 205b, and 205c are respectively disposed in the subpixels R-SP, G-SP, and B-SP. The hole injection layers 201a, 201b, 201c and the hole transport layers 203a, 203b, 203c disposed below each of the red-emitting, green-emitting, and blue-emitting material layers 205a, 205b, and 205c are disposed in each of the subpixels R-SP, G-SP, and B-SP.

In the OLED display device 100 according to the embodiment of the present invention, an inorganic patterns 210a, 210b, 210c are disposed on each of the red-emitting, green-emitting, and blue-emitting material layers 205a, 205b, and 205c in each of the subpixels R-SP, G-SP, and B-SP. The electron transport layer 207 and the electron injection layer 209 can be disposed on the inorganic patterns 210a, 210b, 210c over the entire surface of the substrate 101 without being patterned in each of the subpixels R-SP, G-SP, and B-SP.

The inorganic patterns 210a, 210b, 210c can be made of amorphous silicon (a-Si). When the inorganic patterns 210a, 210b, 210c are made of amorphous silicon, the inorganic patterns 210a, 210b, 210c can be doped with Group V elements such as phosphorus (P).

Alternatively, the inorganic patterns 210a, 210b, 210c can be doped with Group III elements such as boron (B).

Alternatively, the inorganic patterns 210a, 210b, 210c can further include a metal compound. The metal compound can include an alkali metal or an alkaline earth metal. The metal compound including the alkali metal or the alkaline earth metal can be at least one selected from the group consisting of LiQ, LiF, NaF, KF, RbF, CsF, FrF, $BeF_2$, $MgF_2$, $CaF_2$, $SrF_2$, $BaF_2$, and $RaF_2$.

When the organic light emitting layer 113 is patterned and formed for each of the subpixels R-SP, G-SP, and B-SP through a photolithography process, the inorganic patterns 210a, 210b, 210c function to prevent each of the red-emitting, green-emitting, and blue-emitting material layers 205a, 205b, and 205c from being exposed to the outside.

The inorganic patterns 210a, 210b, 210c suffer less damage from an outside environment as compared to an organic material in a photolithography process or the like. Accordingly, the inorganic patterns 210a, 210b, 210c can be disposed on the red-emitting, green-emitting, and blue-emitting material layers 205a, 205b, and 205c, thereby preventing the red-emitting, green-emitting, and blue-emitting material layers 205a, 205b, and 205c from being damaged when the electron transport layer 207 and the electron injection layer 209 are formed on the red-emitting, green-emitting, and blue-emitting material layers 205a, 205b, and 205c.

In particular, since the inorganic patterns 210a, 210b, 210c are doped with phosphorus (P), boron (B), or the like or includes a metal compound, the inorganic patterns 210a, 210b, 210c facilitate an energy transfer between the emitting material layers 205a, 205b, and 205c and the electron transport layer 207.

More specifically, the emitting material layers 205a, 205b, and 205c are respectively made of materials which emit red, green, and blue light, and can be formed using a phosphorescent or fluorescent material.

The red-emitting material layer 205a can include a host material, which includes carbazole biphenyl (CBP) or 1,3-bis(carbazol-9-yl) (mCP), and can include a phosphorescent material including a dopant which includes at least one selected from the group consisting of PIQIr(acac)(bis(1-phenylisoquinoline)acetylacetonate iridium), PQIr(acac)(bis (1-phenylquinoline)acetylacetonate iridium), PQIr(tris(1-phenylquinoline)iridium), and PtOEP(octaethylporphyrin platinum). Alternatively, the red-emitting material layer 205a can include a fluorescence material including PBD:Eu (DBM)3(Phen) or perylene.

In the case of the red-emitting material layer 205a, the host material can have a valance band level of −5.0 eV to −6.5 eV and a conduction band level of −2.0 eV to −3.5 eV In addition, the dopant material can have a valance band level of −4.0 eV to −6.0 eV and a conduction band level of −2.4 eV to −3.5 eV The conduction band level of the host material can include the conduction band level of the dopant material. In other words, the conduction band level of the dopant material can be within the conduction band level of the host material.

The green-emitting material layer 205b emits green light and can include a host material including CBP or mCP, and can include a phosphorescent material including a dopant material which includes Ir(ppy)3(fac tris(2-phenylpyridine) iridium). Alternatively, the green-emitting material layer 205b can include a fluorescence material including Alq3(tris (8-hydroxyquinolino)aluminum).

In the case of the green-emitting material layer 205b, the host material can have a valance band level of −5.0 eV to −6.5 eV and a conduction band level of −2.0 eV to −3.5 eV In addition, the dopant material can have a valance band level of −4.5 eV to −6.0 eV and a conduction band level of −2.0 eV to −3.5 eV The conduction band level of the host material can include the conduction band level of the dopant material. In other words, the conduction band level of the dopant material can be within the conduction band level of the host material.

The blue-emitting material layer 205c can include a host material including CBP or mCP, and can include a phosphorescent material including a dopant material which includes (4,6-F2 ppy)2Irpic. Alternatively, the blue-emitting material layer 205c can include a fluorescence material including one selected from the group consisting of spiro-DPVBi, spiro-6P, distyryl-benzene (DSB), distyryl-arylene (DSA), a PFO-based polymer, and a PPV-based polymer.

In the case of the blue-emitting material layer 205c, the host material can have a valance band level of −5.0 eV to −6.5 eV and a conduction band level of −2.0 eV to −3.5 eV In addition, the dopant material can have a valance band level of −4.5 eV to −6.0 eV and a conduction band level of −2.0 eV to −3.5 eV The conduction band level of the host material can include the conduction band level of the dopant material. In other words, the conduction band level of the dopant material can be within the conduction band level of the host material.

The electron transport layer 207 can function to facilitate electron transport and can be made of at least one selected from the group consisting of Alq3(tris(8-hydroxyquinolino) aluminum), PBD, TAZ, Spiro-PBD, Balq, and Salq.

In order to facilitate transport of electrons to the emitting material layers 205a, 205b, and 205c, the electron transport layer 207 can have a valance band level of −5.0 eV to −6.5 eV and a conduction band level of −2.5 eV to −3.8 eV.

In order to facilitate transport of electrons to the red-emitting, green-emitting, and blue-emitting material layers 205a, 205b, and 205c, the electron injection layer 209 can have a valance band level of −5.0 eV to −6.5 eV and a conduction band level of −2.5 eV to −3.5 eV. The highest valence band level of the electron injection layer 209 can be lower than or equal to the highest valence band level of the electron transport layer 207, and the lowest conduction band level of the electron injection layer 209 can be lower than or equal to the lowest conduction band level of the electron transport layer 207.

The highest valence band level of the electron injection layer 209 can be greater than or equal to the highest valence band level of the second electrode 115, i.e., the cathode, and the lowest conduction band level of the electron injection layer 209 can be greater than the highest valence band level of the cathode 115.

In this case, the inorganic patterns 210a, 210b, 210c disposed on each of the red-emitting, green-emitting, and blue-emitting material layers 205a, 205b, and 205c can have a conduction band level of −2.0 eV to −4.0 eV and a valence band level of −5.0 eV to −5.7 eV.

The highest valence band level of the inorganic patterns 210a, 210b, 210c can be lower than or equal to the highest valence band level of the electron transport layer 207, and the lowest conduction band level of the inorganic patterns 210a, 210b, 210c can be lower than or equal to the lowest conduction band level of the electron transport layer 207.

Alternatively, when the electron transport layer 207 is not formed, the highest valence band level of the inorganic patterns 210a, 210b, 210c can be lower than or equal to the highest valence band of the electron injection layer 209, and the lowest conduction band level of the inorganic patterns 210a, 210b, 210c can be lower than or equal to the lowest conduction band level of the electron injection layer 209.

In the OLED display device 100 according to the embodiment of the present invention, when the organic light emitting layer 113 is patterned and formed in each of the subpixels R-SP, G-SP, and B-SP through a photolithography process, the inorganic patterns 210a, 210b, 210c having conductivity can be disposed on each of the red-emitting, green-emitting, and blue-emitting material layers 205a, 205b, and 205c, thereby preventing the red-emitting, green-emitting, and blue-emitting material layers 205a, 205b, and 205c from being exposed to the outside.

Accordingly, although the organic light emitting layer 113 is formed through the photolithography process, the organic light emitting layer 113 can be stably patterned and formed for each of the sub-pixels R-SP, G-SP, and B-SP.

This is described in more detail further with reference to FIGS. 4A to 4M below.

FIGS. 4A to 4M are process cross-sectional views illustrating a manufacturing method of an OLED display device according to an embodiment of the present invention.

A manufacturing method of an OLED display device 100 (e.g., see FIG. 3) according to an embodiment of the present invention can be characterized by a process of forming an LED E (see FIG. 3). Since the process of forming a driving thin film transistor (DTr of FIG. 3) can be not greatly different from a conventional manufacturing method, descriptions thereof can be omitted or brief. The following descriptions can be made based on a portion for manufacturing the LED E (see FIG. 3) as a main portion of an example of the present invention.

Figure 4A:
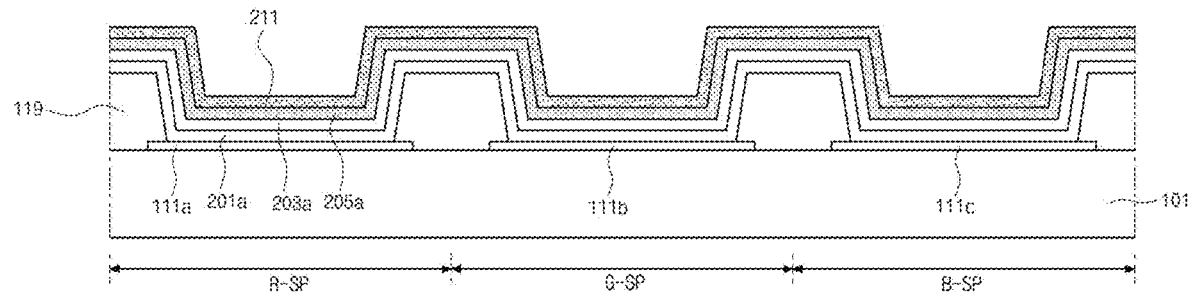
FIGS. 4A to 4M are process cross-sectional views illustrating a manufacturing method of an OLED display device according to an embodiment of the present invention.

As shown in FIG. 4A, a driving thin film transistor DTr (e.g., see FIG. 3) and a first electrodes 111a, 111b, 111c are formed in each of subpixels R-SP, G-SP, and B-SP on a substrate 101. The first electrodes 111a, 111b, 111c are connected to a drain electrode DD of the driving thin film transistor DTr through a drain contact hole PH (e.g., see FIG. 3) formed in first and second interlayer insulating layers 109a and 109b (e.g., see FIG. 3).

Next, a bank 119 configured to expose an emission region of each of the subpixels R-SP, G-SP, and B-SP is formed along an edge of the first electrodes 111a, 111b, 111c. Then, a hole injection layers 201a, 201b, 201c, a hole transport layers 203a, 203b, 203c, a red-emitting material layer 205a, and an inorganic layer 211 are sequentially formed on the entire surface of the substrate 101 on which the bank 119 is formed.

The hole injection layers 201a, 201b, 201c, the hole transport layers 203a, 203b, 203c, the red-emitting material layer 205a, and the inorganic layer 211 can be formed using an evaporation method or a spin coating method.

Figure 4B:
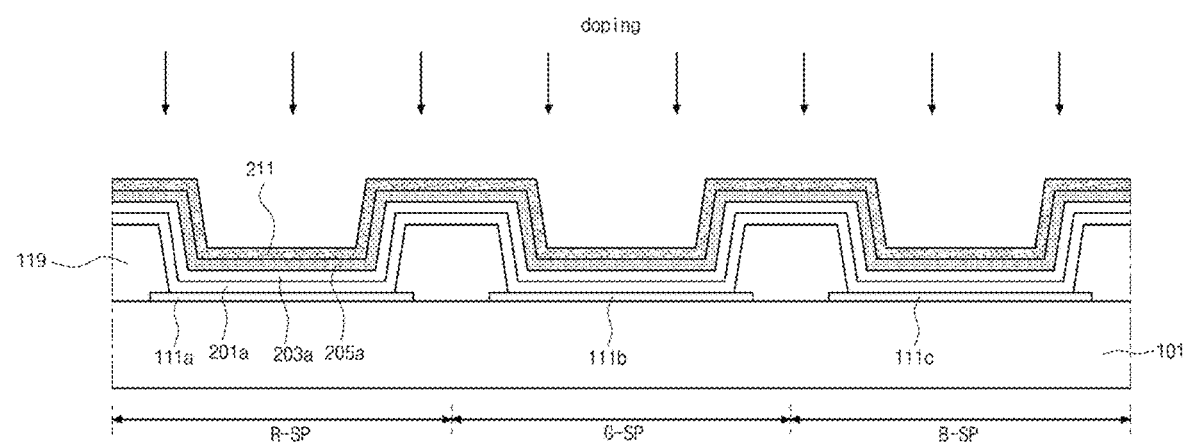

Then, as shown in FIG. 4B, the entire surface of the inorganic layer 211 is doped with phosphorus, boron, or a metal compound.

Figure 4C:
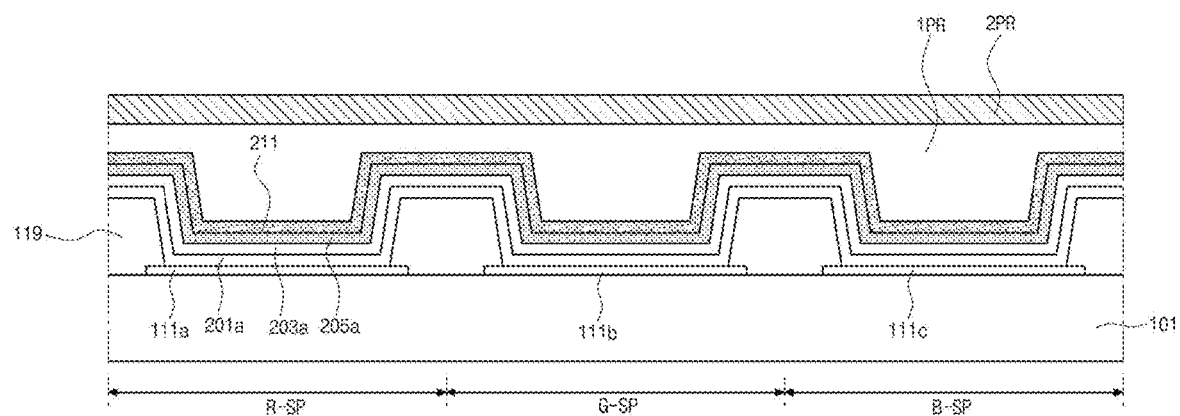

Next, as shown in FIG. 4C, a first photoresist 1PR and a second photoresist 2PR are deposited on the entire surface of the inorganic layer 211.

Figure 4D:
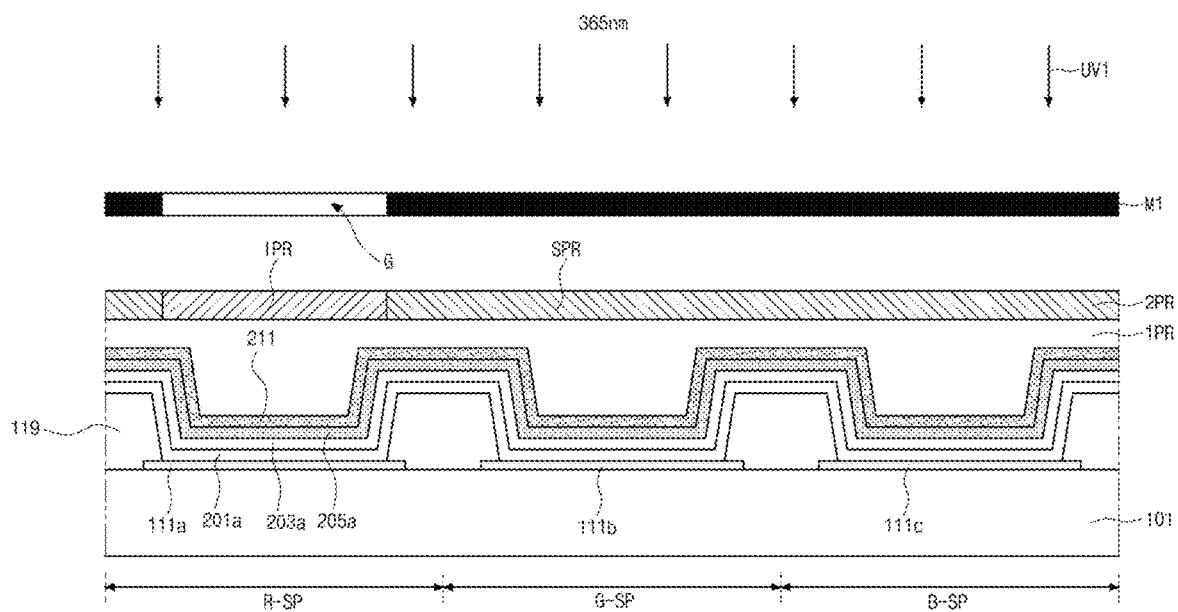

As shown in FIG. 4D, a mask M1 having an opening G corresponding to the red subpixel R-SP is provided, and a first ultraviolet ray UV1 having a wavelength of 365 nm is irradiated thereon. The second photoresist 2PR disposed to correspond to the red subpixel R-SP is exposed to the first ultraviolet ray UV1 through the opening G of the mask M1, and other portions of the second photoresist 2PR are not affected by the first ultraviolet ray UV1.

The second photoresist 2PR exposed to the first ultraviolet ray UV1 becomes an insoluble photoresist IPR, while the portions thereof not exposed to the first ultraviolet ray UV1 become a soluble photoresist SPR.

In this case, the first photoresist 1PR functions to protect the hole injection layers 201a, 201b, 201c, the hole transport layers 203a, 203b, 203c, the red-emitting material layer 205a, and the inorganic layer 211 which are disposed below the first photoresist 1PR.

Figure 4E:
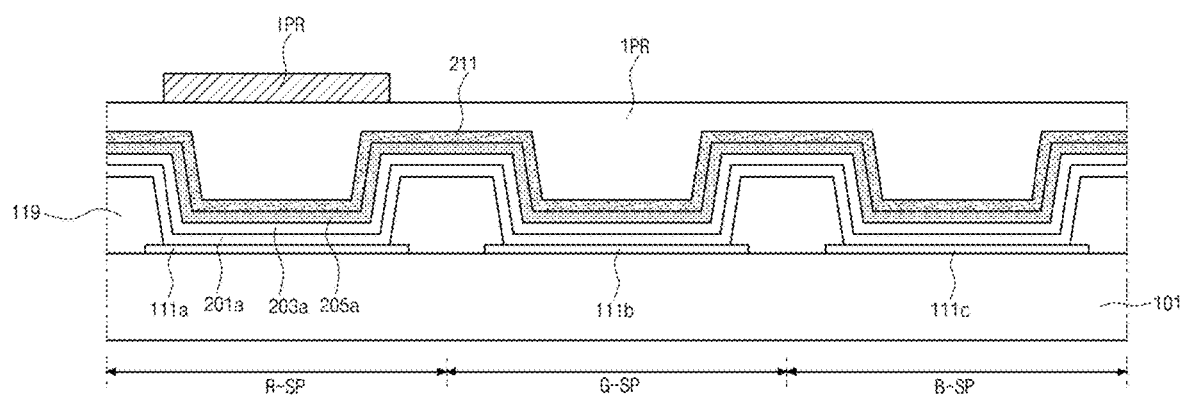

Next, as shown in FIG. 4E, when the exposed second photoresist 2PR, for which an exposure process is performed, is exposed to a fluorinated (or highly fluorinated) solvent, the soluble photoresist SPR of the second photoresist 2PR is removed. On the contrary, the insoluble photoresist IPR remains on the first photoresist 1PR.

Figure 4F:
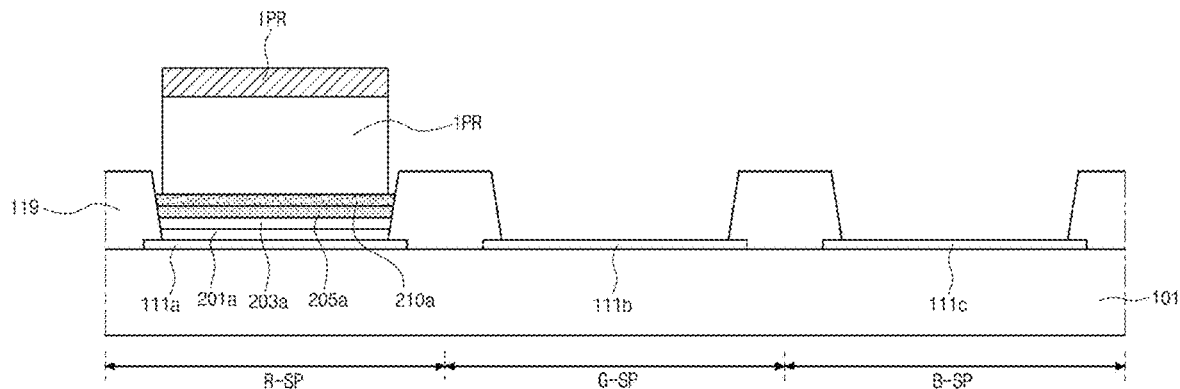

As shown in FIG. 4F, by using the remaining insoluble photoresist IPR of the second photoresist 2PR as a mask, the first photoresist 1PR disposed below the second photoresist 2PR is etched, and all of the hole injection layers 201a, 201b, 201c, the hole transport layers 203a, 203b, 203c, the red-emitting material layer 205a, and the inorganic layer 211, which are exposed outside the first photoresist 1PR, are etched and removed.

Figure 4G:
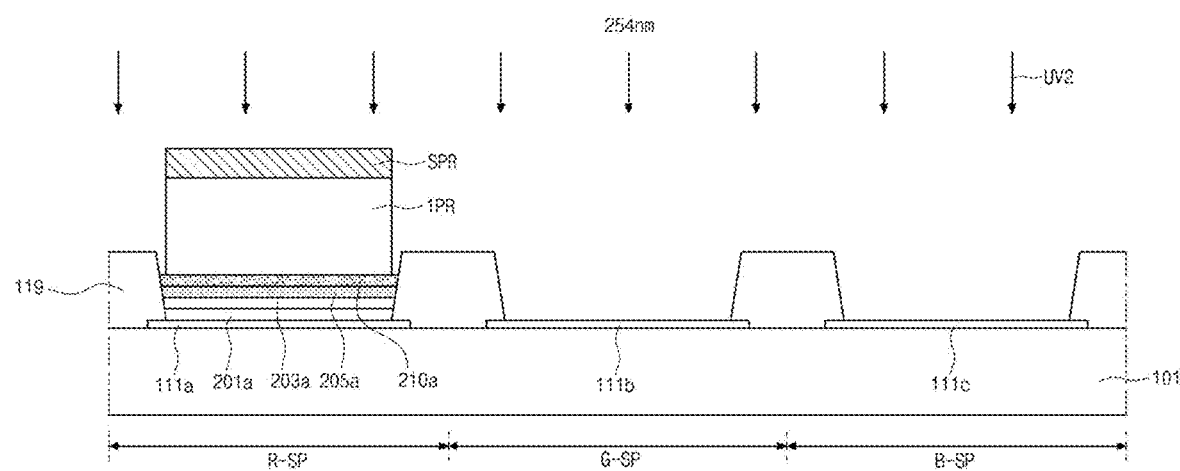

Next, as shown in FIG. 4G, a second ultraviolet ray UV2 having a wavelength of 254 nm is irradiated onto the entire surface of the substrate 101. Thus, the insoluble photoresist IPR of the second photoresist 2PR is converted into a soluble photoresist SPR.

Figure 4H:
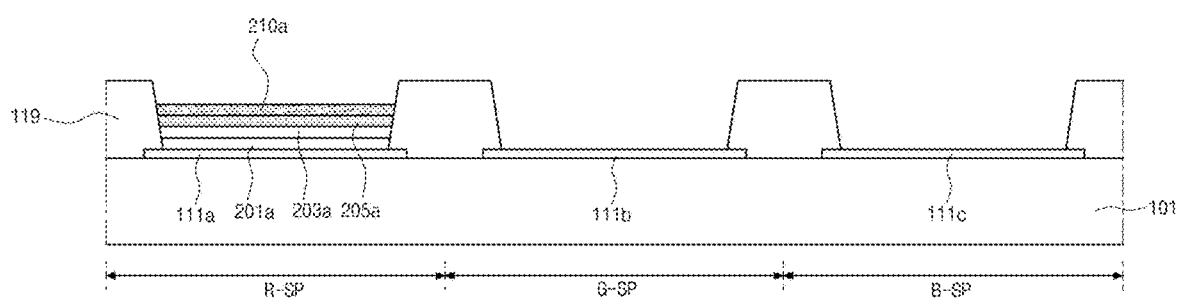

Then, as shown in FIG. 4H, the first photoresist 1PR and the soluble photoresist SPR of the second photoresist 2PR are removed using a highly fluorinated solvent. The same highly fluorinated solvent can be used both in a case in which the first photoresist 1PR and the second photoresist 2PR are developed and in a case in which the first photoresist 1PR and the second photoresist 2PR are stripped.

Therefore, the hole injection layers 201a, 201b, 201c, the hole transport layers 203a, 203b, 203c, the red-emitting material layer 205a, and the inorganic layer 211 are formed at the red subpixel R-SP in a shape of the soluble photoresist SPR of the second photoresist 2PR on the substrate 101.

As a result, a structure, in which the hole transport layers 203a, 203b, 203c are formed on the hole injection layers 201a, 201b, 201c, the red-emitting material layer 205a is disposed on the hole transport layers 203a, 203b, 203c, and the inorganic pattern 210a is stacked on the red-emitting material layer 205a, is completed so as to correspond to an emission region EA of the red subpixel R-SP.

Figure 4I:
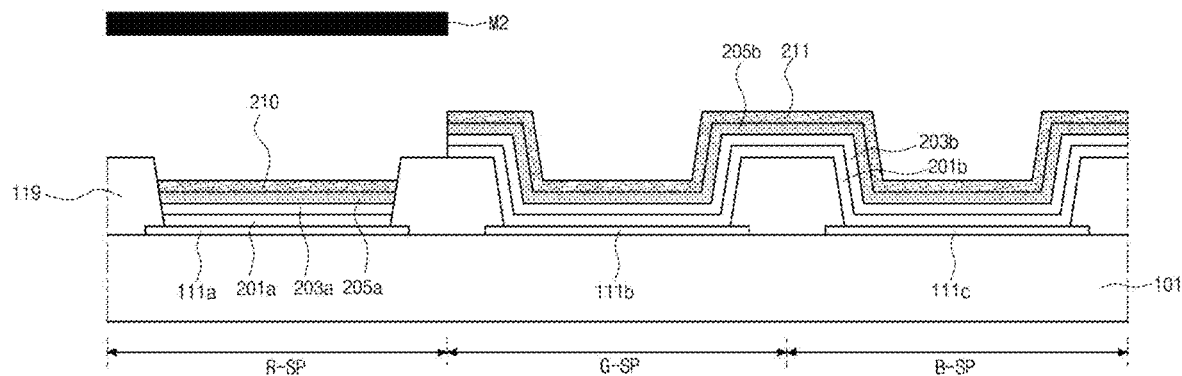

As shown in FIG. 4I, after the red subpixel R-SP is completed, a mask M2 is disposed to correspond to the red subpixel R-SP. A hole injection layers 201a, 201b, 201c, a hole transport layers 203a, 203b, 203c, a green-emitting material layer 205b, and an inorganic layer 211 are sequentially formed on the entire surface of the substrate 101 excluding the red subpixel R-SP. Then, a series of the above-described processes for the red subpixel R-SP are applied similarly.

Figure 4J:
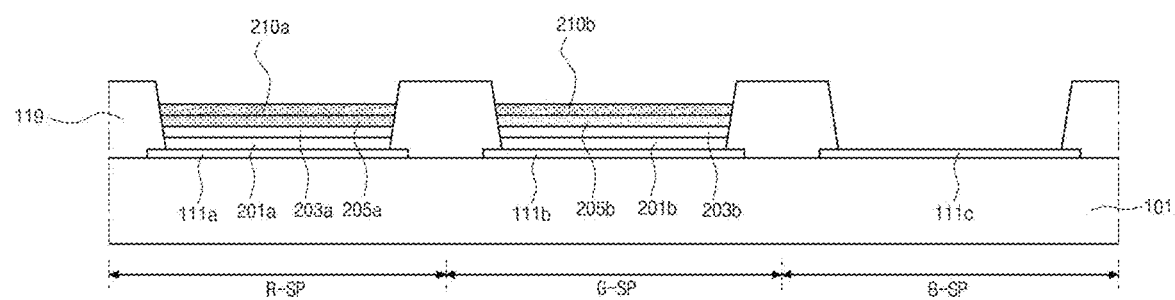

Accordingly, as shown in FIG. 4J, a structure, in which the hole transport layers 203a, 203b, 203c are disposed on the hole injection layers 201a, 201b, 201c, the green-emitting material layer 205b is disposed on the hole transport layers 203a, 203b, 203c, and the inorganic pattern 210b stacked on the green-emitting material layer 205b, is completed so as to correspond to an emission region EA of the green subpixel G-SP.

Figure 4K:
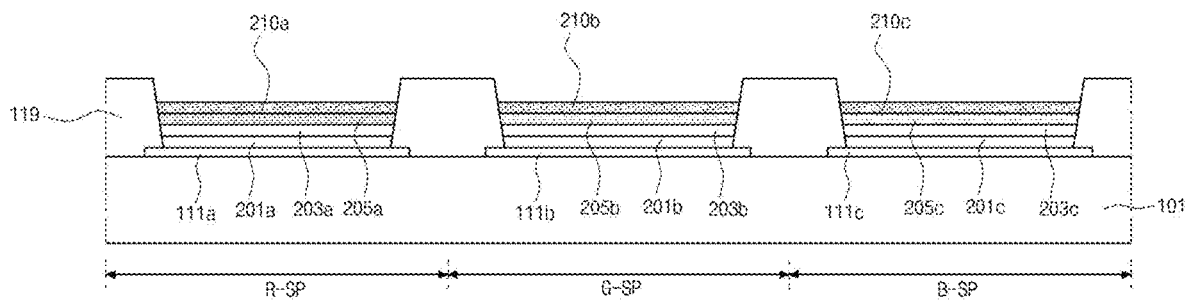

Then, as shown in FIG. 4K, a series of the above-described processes is applied similarly to form the hole injection layers 201a, 201b, 201c, the hole transport layers 203a, 203b, 203c, the blue-emitting material layer emission layer 205c, and the inorganic pattern 210c so as to correspond to the blue subpixel B-SP.

Figure 4L:
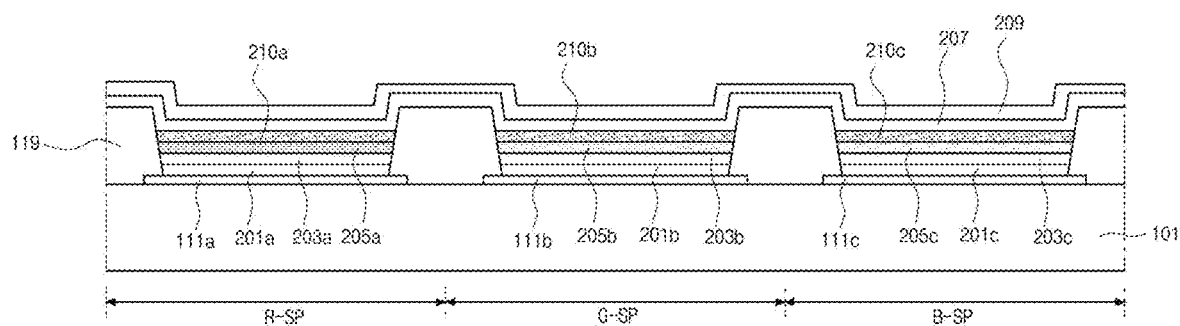

Then, as shown in FIG. 4L, an electron transport layer 207 and an electron injection layer 209 are sequentially stacked on the inorganic patterns 210a, 210b, 210c of the red, green, and blue subpixels R-SP, G-SP, and B-SP over the entire surface of the substrate 101.

The electron transport layer 207 and the electron injection layer 209 can be formed using an evaporation method or a spin coating method.

Figure 4M:
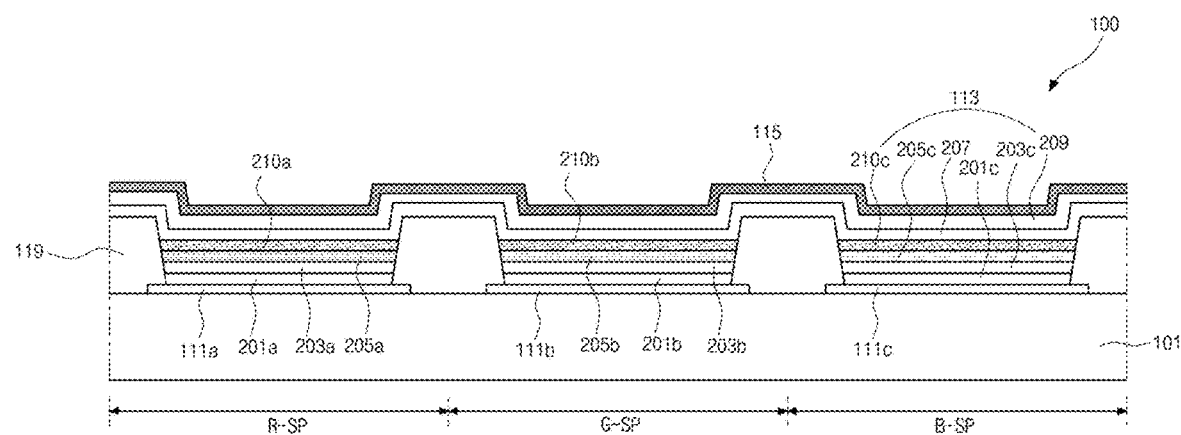

Next, as shown in FIG. 4M, a second electrode 115 is formed on the electron injection layer 209. Accordingly, the OLED display device 100 according to the embodiment of the present invention is completed.

The second electrode 115 can be formed using a sputtering method, an evaporation method, a vapor phase deposition method, or an electron beam deposition method.

In the OLED display device 100 according to the embodiment of the present invention, after the hole injection layers 201a, 201b, 201c, the hole transport layers 203a, 203b, 203c, and the emitting material layers 205a, 205b, and 205c are deposited on the substrate 101 in a vacuum atmosphere, the substrate 101 is exposed to the atmosphere in order to coat the first photoresist 1PR and the second photoresist 2PR on the emitting material layer 205a, 205b, and 205c.

In this case, when the inorganic patterns 210a, 210b, 210c are not disposed on the emitting material layer 205a, 205b, and 205c, the emitting material layers 205a, 205b, and 205c themselves are exposed to the atmosphere. Therefore, the emitting material layers 205a, 205b, and 205c are vulnerable to moisture or oxygen and thus can be damaged.

In other words, in the OLED display device 100 according to the embodiment of the present invention, the inorganic patterns 210a, 210b, 210c can be disposed on each of the emitting material layers 205a, 205b, and 205c, thereby preventing the emitting material layers 205a, 205b, and 205c from being exposed to the outside when the organic light emitting layer 113 is formed through a photolithography process.

In addition, the inorganic patterns 210a, 210b, 210c are disposed on each of the red-emitting, green-emitting, and blue-emitting material layers 205a, 205b, and 205c, thereby preventing the red-emitting, green-emitting, and blue-emitting material layers 205a, 205b, and 205c from being damaged when the electron transport layer 207 and the electron injection layer 209 are formed on the red-emitting, green-emitting, and blue-emitting material layers 205a, 205b, and 205c.

In the OLED display device 100 according to the embodiment of the present invention, the inorganic patterns 210a, 210b, 210c can be disposed on each of the emitting material layers 205a, 205b, and 205c so that the OLED display device 100 according to the embodiment of the present invention can implement a micro cavity effect.

In this regard, in the OLED display device 100 according to the embodiment of the present invention, the second electrode 115 of the LED (e.g., E of FIG. 3) can have a reflective property using, for example, triple-layered structure of ITO/APC/ITO, and the first electrodes 111a, 111b, 111c can have a semi-transmissive property using, for example, a semi-transmissive conductive material such as magnesium (Mg), silver (Ag), or an alloy of magnesium (Mg) and silver (Ag). Accordingly, luminous efficiency can increase due to a micro cavity.

The micro cavity effect is a phenomenon in which light reflected between mirrors are destructively or constructively interfered with each other, and only a light having a specific wavelength remains and a light having other wavelengths is cancelled, thereby increasing intensity of a light having a specific wavelength.

In order to implement the micro cavity effect, a depth or a length of a micro cavity between the first electrodes 111a, 111b, 111c and the second electrode 115 or between the first electrodes 111a, 111b, 111c and second electrode 115 and the emitting material layer 205a, 205b, or 205c of the organic light emitting layer 113 is formed for each of the subpixels R-SP, G-SP, and B-SP such that a resonant wavelength corresponding to a desired color peak wavelength is secured.

More specifically, in the OLED display device 100 according to the present application, one unit pixel (e.g., P of FIG. 3) can include adjacent red, green, and blue subpixels R-SP, G-SP, and B-SP. An effective depth of the micro cavity can be defined by an optical distance, i.e., a wavelength. Since a wavelength of red light can be longer than a wavelength of green light, a depth of a micro cavity for the red subpixel R-SP can be greater than a depth of a micro cavity for the green subpixel G-SP.

Since a wavelength of green light is longer than a wavelength of blue light, a depth of a micro cavity for the green subpixel G-SP is greater than a depth of a micro cavity for the blue subpixel B-SP.

In order to implement a micro cavity effect, the red, green, and blue subpixels R-SP, G-SP, and B-SP can satisfy Expression 1 below:

$$n*d=(2m-1)\lambda(m=0, 1, 2, \ldots)$$ (Expression 1)

In Expression 1, n can be a refractive index of the emitting material layer 205a, 205b, or 205c, d can be a distance between the emitting material layer 205a, 205b, or 205c and the second electrode 115, m can be a constant, and λ is a desired central wavelength.

Accordingly, in an example, the inorganic patterns 210a, 210b, 210c disposed on the red-emitting material layer 205a of the red subpixel R-SP can be formed to have a first thickness. The inorganic patterns 210a, 210b, 210c disposed on the green-emitting material layer 205b of the green subpixel G-SP can be formed to have a second thickness less than the first thickness. The inorganic patterns 210a, 210b, 210c disposed on the blue-emitting material layer 205c of the blue subpixel B-SP can be formed to have a third thickness less than the second thickness.

Due to the inorganic patterns 210a, 210b, 210c formed to have thicknesses which differ for each of the red, green, and blue subpixels R-SP, G-SP, and B-SP, a distance from the first electrodes 111a, 111b, 111c of the red subpixel R-SP to the second electrode 115 thereof can be the longest distance, the first electrodes 111a, 111b, 111c of the blue subpixel B-SP to the second electrode 115 thereof can be the shortest distance, and a distance from the first electrodes 111a, 111b, 111c of the green subpixel G-SP to the second electrode 115 thereof can be a middle distance.

In other words, a depth of a micro cavity of the red subpixel R-SP can be the longest depth, a depth of a micro cavity of the blue subpixel B-SP can be the shortest depth, and a depth of a micro cavity of the green subpixel G-SP can be a middle depth.

Therefore, since the light emitted from each of the subpixels R-SP, G-SP, and B-SP is constructively interfered, luminous efficiency can be optimized in each of the subpixels R-SP, G-SP, and B-SP and power consumption can be reduced.

Figure 5:
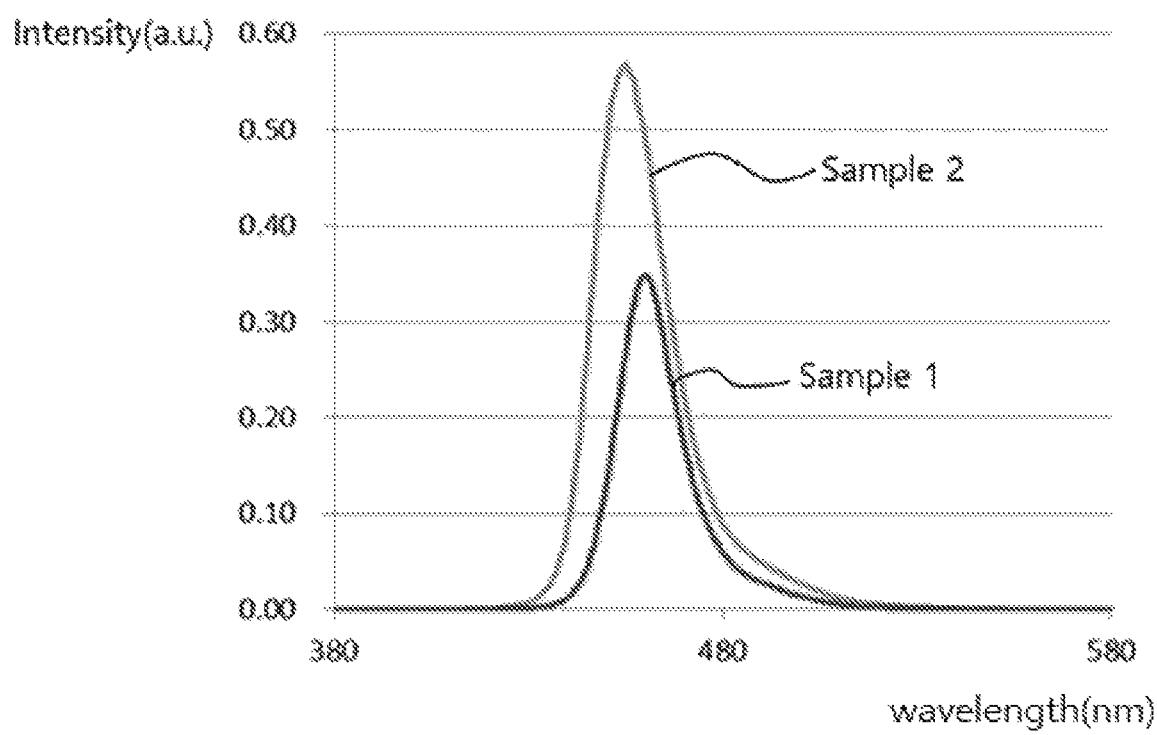
FIG. 5 is a graph showing a comparison of luminous efficiencies of an OLED display device according to an embodiment of the present invention and a comparative OLED display device.

FIG. 5 is a graph showing a comparison of luminous efficiency of the OLED display device 100 according to the embodiment of the present invention and luminous efficiency of a comparative OLED display device. FIG. 5 shows results measured only in the blue subpixel B-SP.

In FIG. 5, a horizontal axis represents a wavelength of visible light region, and a vertical axis represents an intensity of light.

Sample 1 represents a spectral distribution of a comparative OLED display device which does not implement a micro cavity effect. Sample 2 represents the OLED display device 100 which implements a micro cavity effect by disposing the inorganic patterns 210a, 210b, 210c on the blue-emitting material layer 205c according to the embodiment of the present invention.

Referring to FIG. 5, it can be seen that the intensity of light in Sample 2 is measured to be higher than that in Sample 1. It can be seen that the efficiency of a blue color in Sample 2 is increased by about 0.22 compared to Sample 1.

As described above, when a micro cavity effect is applied, it can be confirmed that the efficiency of a blue color is increased by about 75%.

In other words, it can be confirmed that the intensity of light of the OLED display device 100 according to the embodiment of the present invention implementing the micro cavity effect is increased. Therefore, it can be seen that the OLED display device 100 according to the embodiment of the present invention improves light efficiency as compared with the comparative OLED display device.

As described above, in the embodiment(s) of the present invention, since an inorganic pattern is disposed on a hole injection layer, a hole transport layer, and a light emitting layer, the light emitting layer can be prevented from being exposed to the outside (or the exposure is minimized) when an organic light emitting layer is formed through a photolithography process. Therefore, stably patterning and forming of the organic light emitting layer for each subpixel can be effectively achieved.

The present invention is not limited to the above-described embodiments, and it will be apparent to those skilled in the art that various modifications and variations can be made in the present invention without departing from the spirit or scope of the invention.

What is claimed is:

1. An organic light emitting diode display device, comprising:
    a substrate including first to third subpixels;
    a first electrode in each of the first to third subpixels;
    a hole injection layer on the first electrode in each of the first to third subpixels;
    first to third light emitting layers, each being on the hole injection layer in each of the first to third subpixels;
    first to third inorganic patterns on the first to third light emitting layers in the first to third subpixels, respectively;
    an electron injection layer on the first to third inorganic patterns and over entire surfaces of the first to third subpixels; and
    a second electrode on the electron injection layer and over entire surfaces of the first to third subpixels,
    wherein the first to third inorganic patterns are made of amorphous silicon (a-Si) and are doped with a group III or V element.

2. The organic light emitting diode display device of claim 1, wherein the first to third inorganic patterns include one selected from a metal compound group consisting of LiQ, LiF, NaF, KF, RbF, CsF, FrF, $BeF_2$, $MgF_2$, $CaF_2$, $SrF_2$, $BaF_2$, and $RaF_2$.

3. The organic light emitting diode display device of claim 1, wherein the first light emitting layer is a red-emitting layer, and the first inorganic pattern has a first thickness,
    wherein the second light emitting layer is a green-emitting layer, and the second inorganic pattern has a second thickness smaller than the first thickness, and
    wherein the third light emitting layer is a blue-emitting layer, and the third inorganic pattern has a third thickness smaller than the second thickness.

4. The organic light emitting diode display device of claim 1, wherein first, second, and third driving thin film transistors are provided in each of the first to third sub pixels,
    wherein the first, second, and third driving thin film transistors each include first, second, and third semiconductor layers, a gate insulating layer on the first, second, and third semiconductor layers, first, second, and third gate electrodes on the gate insulating layer, a first interlayer insulating layer on the first, second, and third gate electrodes, and first, second, and third source electrodes and first, second, and third drain electrodes disposed on the first interlayer insulating layer, and
    wherein the first electrode is on a second interlayer insulating layer which is on the first, second, and third source electrodes and the first, second, and third drain electrodes.

5. The organic light emitting diode display device of claim 1, wherein the electron injection layer and the electron transport layer are over entire surfaces of the first to third subpixels.

6. The organic light emitting diode display device of claim 1, wherein a thickness of the first inorganic pattern is greater than a thickness of the second inorganic pattern, and the thickness of the second inorganic pattern is greater than a thickness of the third inorganic pattern.

7. The organic light emitting diode display device of claim 6, wherein a first distance from the first electrode to the second electrode at the first subpixel is greater than a second distance from the first electrode to the second electrode at the second subpixel, and a third distance from the first electrode to the second electrode at the third subpixel is less than the second distance.

8. The organic light emitting diode display device of claim 6, wherein the first subpixel is a red subpixel, the second subpixel is a green subpixel, and the third subpixel is a blue subpixel.

9. An organic light emitting diode display device, comprising:
    a substrate including first to third subpixels;
    a first electrode in each of the first to third subpixels;
    a hole injection layer on the first electrode in each of the first to third subpixels;
    first to third light emitting layers, each being on the hole injection layer in each of the first to third subpixels;
    first to third inorganic patterns in contact with the first to third light emitting layers in the first to third subpixels, respectively and configured to protect the first to third light emitting layers from exposure to the outside;
    an electron transport layer on the first to third inorganic patterns;
    an electron injection layer on the first to third inorganic patterns; and
    a second electrode on the electron injection layer,
    wherein a highest valence band level of the first to third inorganic patterns is less than or equal to a highest valence band level of the electron injection layer, and a lowest conduction band level of the first to third inorganic patterns is less than or equal to a lowest conduction band level of the electron injection layer.

10. The organic light emitting diode display device of claim 9, wherein the electron transport layer is between the first to third inorganic patterns and the electron injection layer, and
    wherein the highest valence band level of the first to third inorganic patterns is less than or equal to a highest valence band level of the electron transport layer, and the lowest conduction band level of the first to third inorganic patterns is less than or equal to a lowest conduction band level of the electron transport layer.

11. An organic light emitting diode display device, comprising:
    a red subpixel including a first hole injection layer on a first portion of a first electrode, a first hole transport layer on the first hole injection layer, a red-emitting layer on the first hole transport layer, a first inorganic pattern in contact with the red-emitting layer, an electron transport layer on the first inorganic pattern, and an electron injection layer on the electron transport layer;
    a green subpixel including a second hole injection layer on a second portion of the first electrode, a second hole transport layer on the second hole injection layer, a green-emitting layer on the second hole transport layer, a second inorganic pattern in contact with the green-emitting layer, the electron transport layer being on the second inorganic pattern, and the electron injection layer being on the electron transport layer;
    a blue subpixel including a third hole injection layer on a third portion of the first electrode, a third hole transport layer on the third hole injection layer, a blue-emitting layer on the third hole transport layer, a third inorganic pattern in contact with the blue-emitting layer, the electron transport layer being on the third inorganic pattern, and the electron injection layer being on the electron transport layer;

a second electrode over the red subpixel, the green subpixel and the blue subpixel; and a first driving thin film transistor provided in the red subpixel, a second driving thin film transistor provided in the green subpixel, a third driving thin film transistor provided in the blue subpixel, wherein the first to third inorganic patterns include amorphous silicon (a-Si) and are doped with a group III or V element.

12. The organic light emitting diode display device of claim 11, wherein a thickness of the first inorganic pattern is different than a thickness of the second inorganic pattern and a thickness of the third inorganic pattern.

13. The organic light emitting diode display device of claim 11, wherein the electron transport layers of the red subpixel, the green subpixel and the blue subpixel have a same thickness.

14. The organic light emitting diode display device of claim 11, wherein a thickness of the first inorganic pattern is greater than a thickness of the second inorganic pattern, and the thickness of the second inorganic pattern is greater than a thickness of the third inorganic pattern.

15. The organic light emitting diode display device of claim 11, wherein a first distance from the first electrode to the second electrode at the red subpixel is greater than a second distance from the first electrode to the second electrode at the green subpixel, and a third distance from the first electrode to the second electrode at the blue subpixel is less than the second distance.

16. The organic light emitting diode display device of claim 11, wherein the first to third inorganic patterns include one selected from a metal compound group consisting of LiQ, LiF, NaF, KF, RbF, CsF, FrF, $BeF_2$, $MgF_2$, $CaF_2$, $SrF_2$, $BaF_2$, and $RaF_2$.

17. The organic light emitting diode display device of claim 11, wherein the first, second, and third driving thin film transistors each include first, second, and third semiconductor layers, a gate insulating layer on the first, second, and third semiconductor layers, first, second, and third gate electrodes on the gate insulating layer, a first interlayer insulating layer on the first, second, and third gate electrodes, and first, second, and third source electrodes and first, second, and third drain electrodes disposed on the first interlayer insulating layer.

18. The organic light emitting diode display device of claim 17, wherein the first electrode is on a second interlayer insulating layer which is on the first, second, and third source electrodes and the first, second, and third drain electrodes.

* * * * *